United States Patent
Otsuka et al.

(10) Patent No.: US 10,279,589 B2
(45) Date of Patent: May 7, 2019

(54) METHOD FOR MANUFACTURING STRUCTURE

(71) Applicant: CANON KABUSHIKI KAISHA, Tokyo (JP)

(72) Inventors: Manabu Otsuka, Kawasaki (JP); Tetsushi Ishikawa, Tokyo (JP); Yasuaki Tominaga, Kawasaki (JP); Tamaki Sato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 159 days.

(21) Appl. No.: 15/601,943

(22) Filed: May 22, 2017

(65) Prior Publication Data

US 2017/0341397 A1    Nov. 30, 2017

(30) Foreign Application Priority Data

May 27, 2016    (JP) .................... 2016-106457

(51) Int. Cl.
| | |
|---|---|
| *B41J 2/01* | (2006.01) |
| *G03F 7/38* | (2006.01) |
| *B41J 2/16* | (2006.01) |
| *B41J 2/14* | (2006.01) |

(52) U.S. Cl.
CPC ........... *B41J 2/1631* (2013.01); *B41J 2/1404* (2013.01); *B41J 2/1603* (2013.01); *B41J 2/1628* (2013.01); *B41J 2/1629* (2013.01); *B41J 2/1635* (2013.01); *B41J 2/1639* (2013.01); *B41J 2/1645* (2013.01); *G03F 7/38* (2013.01); *B41J 2002/14467* (2013.01)

(58) Field of Classification Search
CPC .. G03F 7/38; B41J 2/1631; B41J 2/162; B41J 2002/14467

USPC .................... 430/320, 330; 347/47
See application file for complete search history.

(56) References Cited

U.S. PATENT DOCUMENTS

| | | | |
|---|---|---|---|
| 2009/0091600 A1* | 4/2009 | Fannin ................... | B41J 2/1404 347/45 |
| 2012/0055022 A1* | 3/2012 | Matsumoto ............ | B41J 2/1603 29/890.1 |
| 2013/0183450 A1* | 7/2013 | Bernard ................... | B05B 1/02 427/402 |

(Continued)

FOREIGN PATENT DOCUMENTS

JP    2008-526553 A    7/2008

*Primary Examiner* — John A McPherson

(74) *Attorney, Agent, or Firm* — Canon U.S.A. Inc., IP Division

(57) ABSTRACT

A method for manufacturing a structure includes, preparing a substrate with a recessed portion provided therein, attaching a film including a photosensitive resin layer containing photosensitive resin therein and a support layer to the substrate to cover the recessed portion with the photosensitive resin layer, irradiating the photosensitive resin layer covering the recessed portion with light via the support layer to form a latent image pattern on the photosensitive resin layer, heating the photosensitive resin layer at 30 degrees Celsius or higher and X degrees Celsius or lower for one minute or longer, wherein a softening point of the photosensitive resin is X degrees Celsius (X≥30), separating the support layer from the photosensitive resin layer, heating the photosensitive resin layer at X+10 degrees Celsius or higher, and carrying out development on the photosensitive resin layer.

20 Claims, 6 Drawing Sheets

(56) References Cited

U.S. PATENT DOCUMENTS

2015/0129542 A1* 5/2015 Ohsumi ............... B41J 2/1639
       216/27
2017/0038689 A1* 2/2017 Ishikawa ............. G03F 7/2024

* cited by examiner

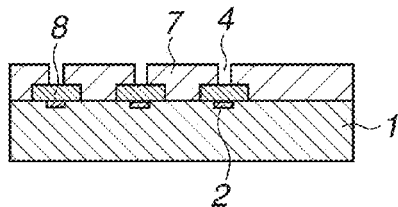
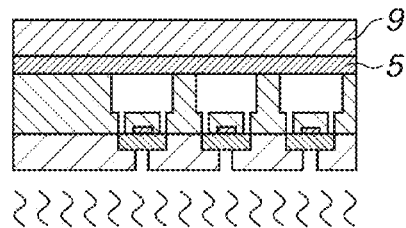
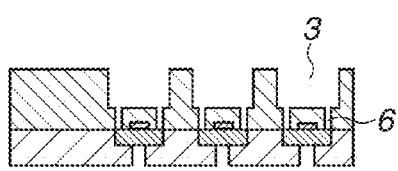
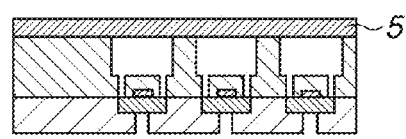
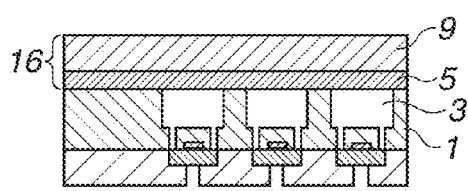
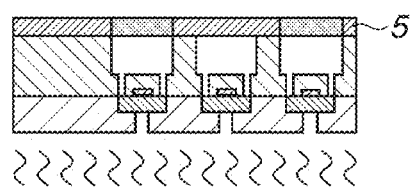
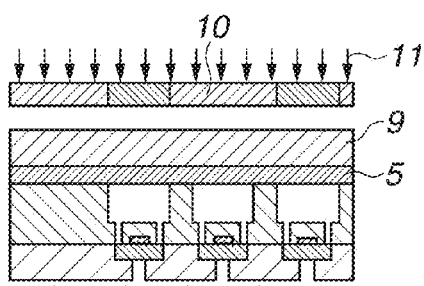
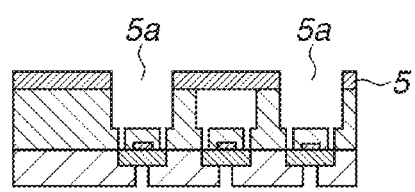
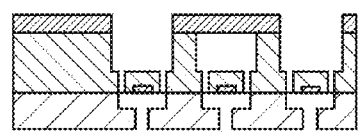

METHOD FOR MANUFACTURING STRUCTURE

BACKGROUND OF THE INVENTION

Field of the Invention

The present disclosure relates to a method for manufacturing a structure, such as a liquid discharge head.

Description of the Related Art

In recent years, inkjet recording apparatuses (liquid discharge recording apparatuses), which record data by discharging liquid, such as ink, have faced a demand for improvement of a printing performance, especially, a high resolution and high-speed printing. One conceivable method to meet this demand is to make discharge ink extremely small, and also achieve an increase in a density of an array of nozzles (discharge ports) to thereby increase the number of pixels per unit area. This type of liquid discharge head includes, on a substrate thereof, energy generation elements that generate energy for discharging the liquid, and a flow passage member forming the discharge ports that discharge the liquid and liquid flow passages in communication with these discharge ports. The liquid flow passages contain the energy generation elements in a part thereof, and these portions are called pressure chambers. Feed holes that feed the liquid to the pressure chambers are provided in the substrate. The feed holes penetrate through the substrate, and feed the liquid from a back surface side of the substrate to the pressure chambers on a front surface side of the substrate.

However, the above-described increase in the density of the array of nozzles also leads to an increase in a density of openings of the feed holes opened on the back surface side of the substrate, thereby making it difficult to secure an adhesion area of the substrate and prevent or reduce mixing of the liquid between the feed holes.

As a method for solving these problems, Japanese Unexamined Patent Application Publication (Translation of PCT Application) No. 2008-526553 discusses a method that attaches a polymer film where a flow passage manifold is processed with use of a laser to a support member for pitch conversion via an adhesive layer, to attach ink feed conduits and the liquid discharge head to each other. According to this method, the liquid is fed via flow passages formed in the polymer film, so that the liquid discharge head can secure the adhesion area and also prevent or reduce the mixing of the liquid. Therefore, this method allows manufacturing of the liquid discharge head with the discharge ports provided at a high density thereon.

SUMMARY OF THE INVENTION

According to an aspect of the present disclosure, a manufacturing method is a method for manufacturing a structure including a substrate with a recessed portion provided therein and a photosensitive resin layer at least partially covering the recessed portion. The method for manufacturing the structure includes, in the following order, preparing the substrate with the recessed portion provided therein, attaching a film including the photosensitive resin layer therein and a support layer supporting the photosensitive resin layer to the substrate to at least partially cover the recessed portion with the photosensitive resin layer, irradiating the photosensitive resin layer covering the recessed portion with light via the support layer to form a latent image pattern on the photosensitive resin layer covering the recessed portion, heating, as a first heating, the photosensitive resin layer by a heating apparatus at 30 degrees Celsius or higher and X degrees Celsius or lower for one minute or longer, wherein a softening point of the photosensitive resin is X degrees Celsius and X≥30, separating the support layer from the photosensitive resin layer, heating, as a second heating, the photosensitive resin layer by a heating apparatus at X+10 degrees Celsius or higher, and carrying out development on the photosensitive resin layer.

Further features of the present disclosure will become apparent from the following description of exemplary embodiments with reference to the attached drawings.

BRIEF DESCRIPTION OF THE DRAWINGS

FIGS. 2A to 2I are diagrams illustrating a method for manufacturing the liquid discharge head.

DESCRIPTION OF THE EMBODIMENTS

In the method discussed in Japanese Unexamined Patent Application Publication (Translation of PCT Application) No. 2008-526553, the polymer film is processed with use of the laser and is attached to the support member, and therefore it is difficult to further improve processing precision and increase the density. Therefore, one conceivable method is to cover the feed holes formed on the back surface side of the substrate with a photosensitive resin layer and pattern this photosensitive resin layer by the photolithography technique, but the present inventor(s) has(have) found out that an issue arises in this case. More specifically, when the photosensitive resin layer has been exposed with use of the photolithography technique and heated by a heating apparatus, the photosensitive resin layer has been softened and accidentally fallen in the feed holes sometimes. One conceivable measure against such a fall is to keep a support layer supporting the photosensitive resin layer attached when exposing and heating the photosensitive resin layer. Since the photosensitive resin layer is exposed and heated with the support layer kept attached thereto, the photosensitive resin layer is supported by the support layer and thus becomes less likely to fall in the feed holes.

However, the support layer thermally expands during processes for exposing and heating the photosensitive resin layer. When the support layer thermally expands, the photosensitive resin is unintentionally deformed since being softened due to heat. The deformation of the photosensitive resin layer results in deterioration of precision of the patterning on the photosensitive resin layer, and thus a failure to acquire an appropriately shaped photosensitive resin layer.

The present disclosure is directed to solving this issue. More specifically, the present disclosure is directed to providing a method for manufacturing a structure, according to which, even when a substrate with a recessed portion formed therein is provided with a photosensitive resin layer at least partially covering the recessed portion and this is patterned by the lithography, the photosensitive resin layer can be appropriately patterned.

In the following description, an exemplary embodiment will be described with reference to the drawings. In the following description, the exemplary embodiment will be described citing a liquid discharge head as one example of the structure.

Figure 1:
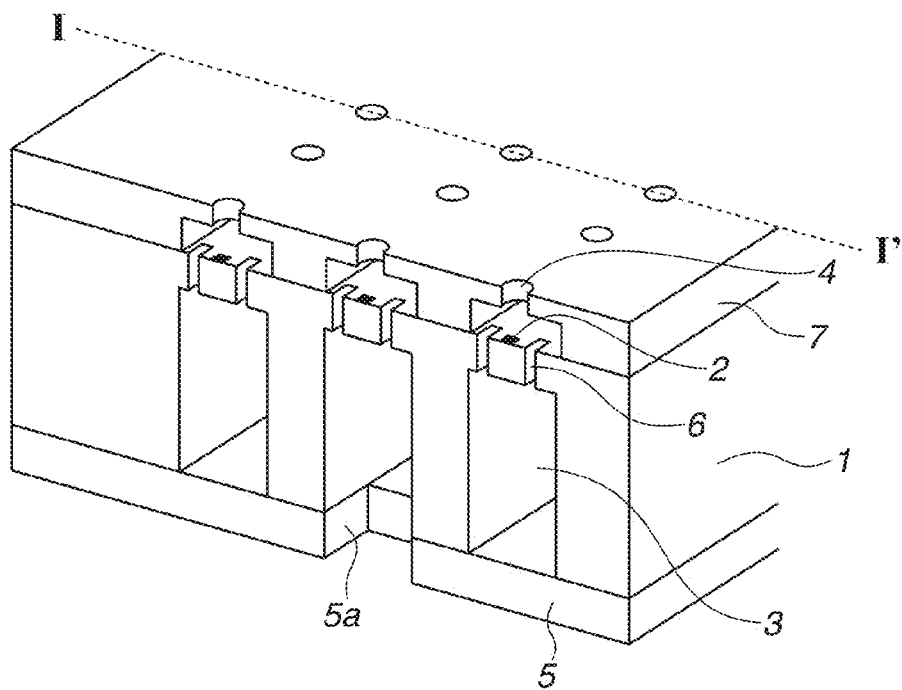
FIG. 1 is a diagram illustrating a cross section of a liquid discharge head.

FIG. 1 illustrates a cross section of the liquid discharge head. The liquid discharge head includes a substrate 1 made from silicon or the like, and an energy generation element 2 and a flow passage member 7 on the substrate 1. The flow passage member 7 forms a flow passage of liquid, a pressure chamber, and a discharge port 4. A feed hole 3 and a feed hole 6 are provided in the substrate 1 as a recessed portion. Because a plurality of individual feed holes 6 is provided for each feed hole 3, the feed hole 3 and the feed hole 6 can also be referred to as a common feed hole and an independent feed hole, respectively. In FIG. 1, the substrate 1 is penetrated through by the feed hole 3 and the feed hole 6, but may be penetrated through, for example, only by the feed hole 3. The feed holes 6 and 3, which are the recessed portion, are opened on a front surface side (one side where the energy generation element 2 is provided) of the substrate 1, and a back surface side opposite therefrom, respectively. The feed hole 3 opened on the back surface side of the substrate 1 is covered over a part thereof with a photosensitive resin layer 5 configured as a cover. An opening 5a is formed in the photosensitive resin layer 5, and the liquid passes through the feed hole 3 and the feed hole 6 from this opening 5a and is fed to the front surface side of the substrate 1. Then, the liquid is provided with energy from the energy generation element 2, and is discharged from the discharge port 4. As the energy generation element 2, for example, a heat generation resistor or a piezoelectric member can be used.

Next, a method for manufacturing a structure including the substrate 1 and the photosensitive resin layer 5 covering the feed hole 3 that is the recessed portion provided in the substrate 1, which are a part of the liquid discharge head, will be described.

FIGS. 2A to 2I illustrate a procedure in which the liquid discharge head is manufactured in cross section taken along I-I' in FIG. 1.

First, as illustrated in FIG. 2A, the substrate 1 is prepared. The energy generation element 2 is provided on the front surface of the substrate 1. A mold material 8 is provided at a portion that will become the flow passage and the pressure chamber, and will shape the flow passage and the pressure chamber by being removed later. The mold material 8 is covered with the flow passage member 7, which will form the discharge port 4 and the flow passage. Desirably, the mold material 8 is made from positive photosensitive resin. Desirably, the flow passage member 7 is made from negative photosensitive resin. The mold material 8 does not necessary have to be provided, and the flow passage, the pressure chamber, the discharge port 4, and the like may be formed by, for example, laminating a plurality of layers made from negative photosensitive resin, forming a latent image thereon, and developing it later.

Next, as illustrated in FIG. 2B, the feed hole 6 and the feed hole 3 are formed in the substrate 1. They are formed by reactive ion etching or wet etching. In the present exemplary embodiment, the feed hole 3 corresponds to the recessed portion. The number of recessed portion(s) may be one or more. In this manner, the substrate 1 with the recessed portion (the feed hole 3) provided therein is prepared. The recessed portion may penetrate through the substrate 1.

Next, as illustrated in FIG. 2C, a film 16 including the photosensitive resin layer 5 containing photosensitive resin therein and a support layer 9 supporting the photosensitive resin layer 5 is attached to the substrate 1. The film 16 is attached to the substrate 1, by which the recessed portion (the feed hole 3) is at least partially covered with the photosensitive resin layer 5. Desirably, the film 16 is attached to the substrate 1 with use of a lamination apparatus, and the recessed portion may be entirely covered with the photosensitive resin layer 5.

Desirably, the photosensitive resin contained in the photosensitive resin layer 5 is negative photosensitive resin. In other words, desirably, the photosensitive resin layer 5 is a negative photosensitive resin composition containing the negative photosensitive resin therein. Examples of the negative photosensitive resin composition include a negative photosensitive resin composition using a radical polymerization reaction, and a negative photosensitive resin composition using a cationic polymerization reaction. The negative photosensitive resin composition using the radical polymerization reaction is cured as polymerization or cross-linking advances between molecules of radically polymerizable monomers or prepolymers contained in the photosensitive resin composition due to radicals generated from a photopolymerization initiator contained in the photosensitive resin composition. Examples of the photopolymerization initiator include benzoins, benzophenones, thioxanthones, anthraquinones, acylphosphine oxides, titanocenes, and acridines. Examples of the radically polymerizable monomers include monomers or prepolymers having an acryloyl group, a methacryloyl group, an acrylamide group, maleic acid diester, or an allyl group. The negative photosensitive resin composition using the cationic polymerization reaction is cured as polymerization or cross-linking advances between molecules of cationically polymerizable monomers or prepolymers contained in the photosensitive resin composition due to cations generated from a cationic photopolymerization initiator contained in the photosensitive resin composition. Examples of the cationic photopolymerization initiator include aromatic iodonium salt and aromatic sulfonium salt. Examples of the cationically polymerizable monomers or prepolymers include monomers or prepolymers having an epoxy group, a vinyl ether group, or an oxetane group.

As the negative photosensitive resin composition, one kind of resin may be used alone or two or more kinds of resin may be used while being mixed. Further, an additive and/or the like can be arbitrarily added thereto as necessary. Specific examples usable as the negative photosensitive resin composition include "SM-8 series" and "KMPR-1000" (trade names) produced by Nippon Kayaku Company Limited, and "TMMR S2000" and "TMMF S2000" (trade names) produced by Tokyo Ohka Kogyo Company Limited.

The photosensitive resin layer 5 prepared in this manner is disposed on the support layer 9. Examples of a method for forming the photosensitive resin layer 5 on the support layer 9 include the spin coating method, the slit die coating method, and the spray coating method.

Desirably, a film thickness of the photosensitive resin layer 5 is 2 μm or thicker and 200 μm or thinner, although the desirable range also depends on a dimension of an opening portion, and a flow amount and viscosity of the liquid to be fed, and the like. The film thickness of the photosensitive resin layer 5 that is thinner than 2 μm makes it impossible to sufficiently cover the feed hole 3, which is the recessed portion, thereby increasing a possibility of a leak of the liquid when the liquid is fed. Further, this thickness increases a possibility of breakage of the photosensitive resin layer 5 as the cover structure due to a liquid feed pressure. On the other hand, the thickness that is thicker than 200 μm makes patterning of the photosensitive resin layer 5 difficult.

Desirably, the support layer 9 is not subjected to a release promoting treatment. The application of the release promoting treatment may result in an unintentional shift of a component of a release promoting agent toward the photosensitive resin layer 5, thereby reducing adhesiveness of the photosensitive resin layer 5. Further, as will be described below, desirably, the support layer 9 is a less diffusely reflective and highly transmissive optical film from the perspective that light irradiation is carried out via the support layer 9. Further, desirably, the support layer 9 is a film having a thermal expansion coefficient of $10^{-4}$ cm/cm° C. or lower.

Examples of a material for making the support layer 9 include a commonly used film, such as polypropylene (PP), polycarbonate (PC), polyethylene terephthalate (PET), and polyimide (PI). More desirably, the material of the support layer 9 is a film made from cycloolefin polymers or cycloolefin copolymers. Examples of the cycloolefin polymer film or the cycloolefin copolymer film include ZeonorFilm ZF14 and ZeonorFilm ZF16 (produced by Zeon Corporation). Besides them, the examples include Fl-Film (produced by Gunze Limited), G3-Film (produced by Dexerials Corporation), and APEL (produced by Mitsui Chemicals Incorporated). Desirably, the support layer 9 is made of at least one of these examples.

Next, as illustrated in FIG. 2D, the photosensitive resin layer 5 is irradiated with light 11 with use of a mask 10 (a light irradiation process). This irradiation with the light 11 is carried out on the photosensitive resin layer 5 covering the recessed portion via the support layer 9. In other words, the photosensitive resin layer 5 is irradiated with the light 11 transmitted through the support layer 9. A latent image pattern is formed on the photosensitive resin layer 5 by this light irradiation (an exposure). The light 11 is desirably ultraviolet light, although the light 11 may be any light that can cure the photosensitive resin layer 5 and can be transmitted through the support layer 9.

An exposure dose should be an exposure dose sufficient to be able to cure the photosensitive resin layer 5, but a portion which is normally unexposed may be accidentally exposed due to light diffusely reflected on a bottom surface of the recessed portion. Therefore, desirably, the exposure dose is set so as to satisfy (the exposure dose)<(an exposure dose for gelling the photosensitive resin layer 5)/{(a transmittance of the support layer 9)×(a transmittance of the photosensitive resin layer 5)×(a reflectivity of the substrate 1)}, and (the exposure dose)>(an exposure dose Eth corresponding to a lower limit for a resolution). The transmittance and the reflectivity here are values with respect to the light 11 transmitted through the support layer 9 and used to irradiate the photosensitive resin layer 5 therewith.

Figure 3A:
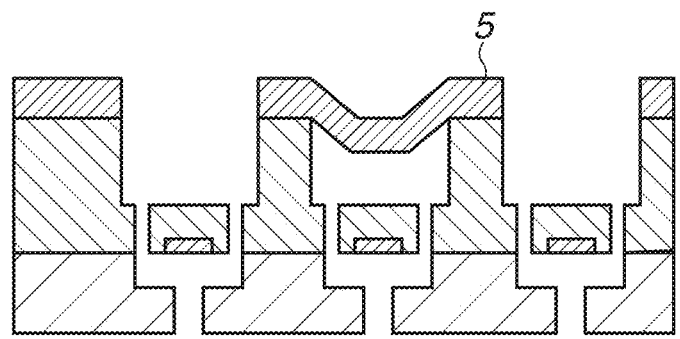
FIGS. 3A and 3B are diagrams each illustrating the cross section of the liquid discharge head.

Next, as illustrated in FIG. 2E, the photosensitive resin layer 5 is heated by a heating apparatus so as to be cured (a first heating process). Examples of the heating apparatus include a hot plate and a heater. In the exemplary embodiment, the photosensitive resin layer 5 is heated in a state supported by the support layer 9 to prevent or reduce a fall of the photosensitive resin layer 5 due to the heat like the one illustrated in FIG. 3A. However, heating the photosensitive resin layer 5 in the state supported by the support layer 9 causes the photosensitive resin layer 5 to be cured in a state deformed due to thermal expansion of the support layer 9 as the support layer 9 thermally expands and the photosensitive resin layer 5 is softened at the same time before the reaction of curing the photosensitive resin layer 5 is completed. As a result, misalignment may occur as indicated by x in FIG. 3B, and there may be a case where it is impossible to pattern the photosensitive resin layer 5 into a desired shape.

Therefore, in the exemplary embodiment, the photosensitive resin layer 5 is heated under conditions at 30 degrees Celsius or higher and X degrees Celsius or lower for one minute or longer, while assuming that a softening point of the photosensitive resin contained in the photosensitive resin layer 5 is X degrees Celsius (X≥30). This heating temperature will be referred to as a first temperature. A reduction in the first temperature necessitates an increase in a heating time period at the time of the curing, but the resin is less softened at the temperature of the softening point or lower, and, further, the thermal expansion of the support layer 9 also reduces as the temperature reduces. Therefore, setting the first temperature in this manner can cure the photosensitive resin layer 5 while preventing or reducing the deformation of the pattern thereon and also preventing or reducing the fall thereof due to the heat.

It is also conceivable to wait for the curing of the photosensitive resin layer 5 by keeping the photosensitive resin layer 5 at a room temperature (25 degrees Celsius) without heating the photosensitive resin layer 5 after the light irradiation, to prevent or reduce the deformation of the pattern. However, this method makes it difficult to advance the curing reaction, thereby undesirably necessitating a detention of the photosensitive resin layer 5 for a long time period to prevent or reduce the deformation of the pattern. On the other hand, the exemplary embodiment can advance the curing reaction in a short time period by heating the photosensitive resin layer 5 with use of the heating apparatus at 30 degrees Celsius or higher. This heating is carried out by the heating apparatus. This means that the temperature of 30 degrees Celsius or higher is not a result of simply leaving the photosensitive resin layer 5 untouched under natural conditions, but is attained by setting (controlling) the temperature with use of the heating apparatus. More desirably, the first temperature is 35 degrees Celsius or higher. Further, desirably, the first temperature is 30 degrees Celsius or higher and 45 degrees Celsius or lower, although the desirable range also depends on the composition of the photosensitive resin layer 5. Further, desirably, the heating time period is two minutes or longer. Further, desirably, the heating time period is 30 minutes or shorter.

After the first heating process, the support layer 9 is separated from the photosensitive resin layer 5, so that the structure is brought into a state illustrated in FIG. 2F (a separation process).

Subsequently, as illustrated in FIG. 2G, the photosensitive resin layer 5 is heated again by a heating apparatus (a second heating process). A heating apparatus similar to the one used in the first heating process can be used therefor. FIG. 2G visually easily understandably illustrates the formed latent image pattern. The photosensitive resin layer 5 is heated in the second heating process at a second temperature higher than the first temperature at which the photosensitive resin layer 5 has been heated in the first heating process. More specifically, the photosensitive resin layer 5 is heated by the heating apparatus at X+10 degrees Celsius or higher. The second heating process is performed to sufficiently advance the curing that has been insufficient to withstand melting at the time of development in the low-temperature heating in the first heating process. Therefore, the second temperature is set to X+10 degrees Celsius or higher, which is sufficiently higher than the first temperature, thereby allowing the photosensitive resin layer 5 to be cured so as to prevent a portion thereof not supposed to be developed from being melted. Desirably, the second temperature is 80 degrees Celsius or higher and 120 degrees Celsius or lower, although the desirable range also depends on the composition of the photosensitive resin layer 5. Further, the second temperature is higher than the first temperature desirably by 30 degrees Celsius or more, and further desirably by 50 degrees Celsius or more.

Next, as illustrated in FIG. 2H, the development is carried out on the photosensitive resin layer 5 (a development process). By this development, the opening 5a is formed in the photosensitive resin layer 5 on the recessed portion according to the previously formed latent image pattern.

As described above, in the exemplary embodiment, the following processes are performed in the order as described: the process for preparing the substrate 1 with the recessed portion provided therein, the process for covering the recessed potion with the photosensitive resin layer 5, the light irradiation process, the first heating process, the separation process, the second heating process, and the development process.

Further, after that, the flow passage and the pressure chamber are formed by removing the mold material 8 as illustrated in FIG. 2I. Then, further heating, electric joining, and/or the like are carried out as necessary. The liquid discharge head is manufactured in the above-described manner.

As described above, the exemplary embodiment performs the light irradiation process before the first heating process. In this light irradiation process, desirably, the exposure dose is set so as to satisfy (the exposure dose)<(the exposure dose for gelling the photosensitive resin layer 5)/{(the transmittance of the support layer 9)×(the transmittance of the photosensitive resin layer 5)×(the reflectivity of the substrate 1)}. The transmittance and the reflectivity here are the values with respect to the light 11 transmitted through the support layer 9 and used to irradiate the photosensitive resin layer 5 therewith.

Desirably, the light irradiation process is performed a plurality of times to facilitate the curing reaction with the aid of the heating after that. The plurality of light irradiation processes will be referred to as a first light irradiation process, and a second light irradiation process performed subsequently to the first light irradiation process. The first light irradiation process is light irradiation for facilitating the curing reaction at the time of the heating, and is not intended to form the opening 5a. On the other hand, the second light irradiation process performed subsequently to the first light irradiation process is light irradiation for forming the opening 5a.

Figure 4:
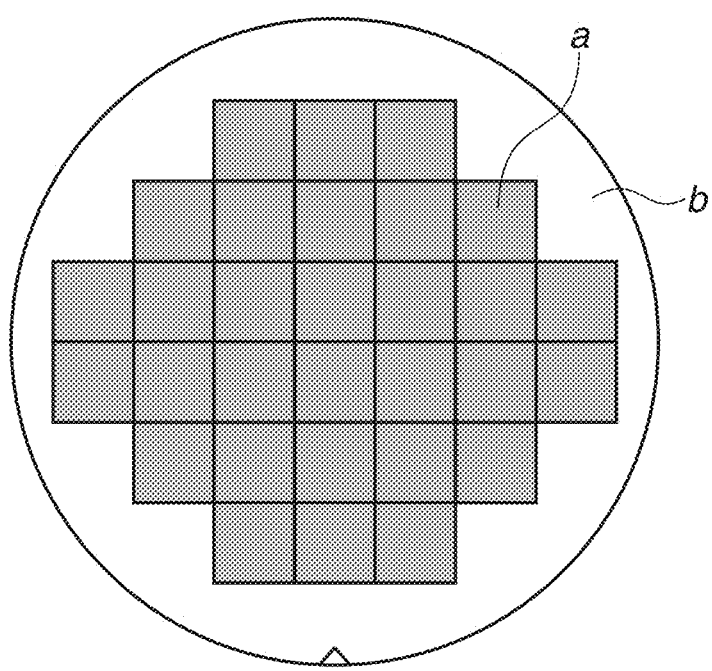
FIG. 4 is a diagram illustrating a light irradiation area.
Figure 5A:
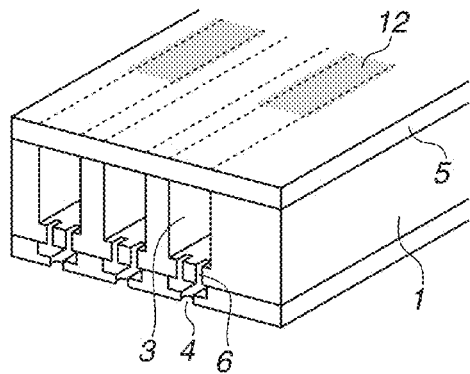
FIGS. 5A to 5E are diagrams each illustrating the cross section of the liquid discharge head.
Figure 5B:
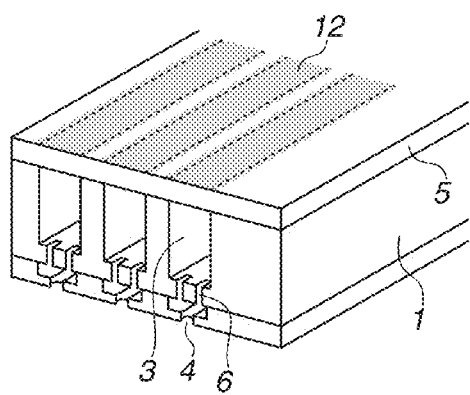
Figure 5C:
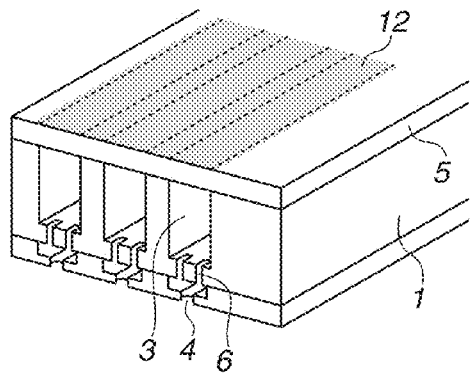

For example, in the case where the negative photosensitive resin layer is used as the photosensitive resin layer 5, at least a region b that excludes an effective chip region a is irradiated with light as illustrated in FIG. 4 in the first light irradiation process. In FIG. 4, the effective chip region a is set as a light non-irradiation region, and only the region b that excludes the effective chip region a is irradiated with the light. However, if the photosensitive resin layer 5 includes a light non-irradiation region 12 at a position on the recessed portion where the opening 5a will be formed as illustrated in FIGS. 5A, 5B, and 5C, the effective chip region a may also be irradiated with the light in the first light irradiation process. In other words, the region targeted for the light irradiation is not limited to the region b in the first light irradiation process as long as at least a part of the photosensitive resin layer 5 on the recessed portion is set as the light non-irradiation region. The effective chip region refers to a chip region usable as a chip of the liquid discharge head. For example, a region at an end of a wafer or the like that cannot satisfy a size of one chip is regarded as a region other than the effective chip region.

The second light irradiation process is performed subsequently to the first light irradiation process. In the second light irradiation process, at least the effective chip region a is irradiated with light. The second light irradiation process is the light irradiation for forming the opening 5a illustrated in FIG. 5E, and the photosensitive resin layer 5 is irradiated with the light in a state including a light non-irradiation region 13 like the one illustrated in FIG. 5D. In the second light irradiation process, a part of the photosensitive resin layer 5 on the recessed portion is set as the light non-irradiation region 13, and the light non-irradiation region 13 is arranged so as to be located inside the light non-irradiation region 12 in the first light irradiation process.

Both the first light irradiation process and the second light irradiation process can also be performed only on inside the effective chip region a. For example, the photosensitive resin layer 5 is irradiated with the light with the first light irradiation process while a part of the region on the recessed portion within the effective chip region a is set as the light non-irradiation region 12, and is irradiated with the light with the second light irradiation process while a region within the light non-irradiation region 12 set in the first light irradiation process is set as the light non-irradiation region 13.

Figure 5D:
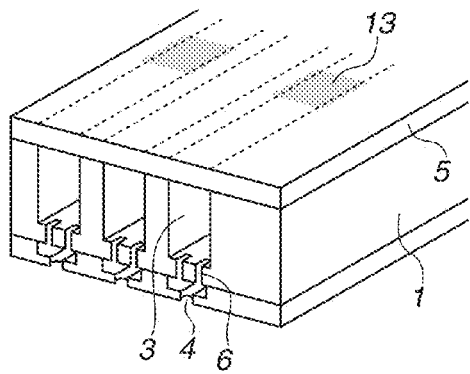
Figure 5E:
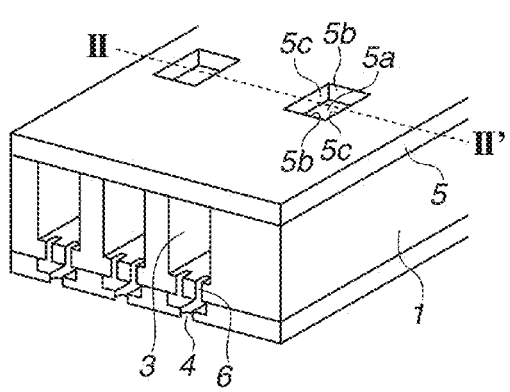
Figure 6A:
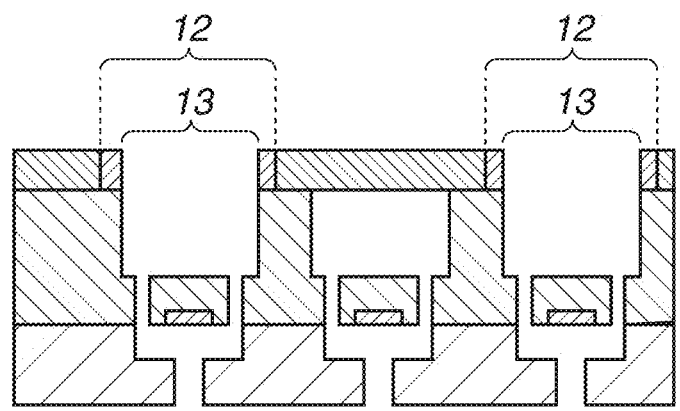
FIGS. 6A and 6B are diagrams each illustrating the cross section of the liquid discharge head.
Figure 6B:
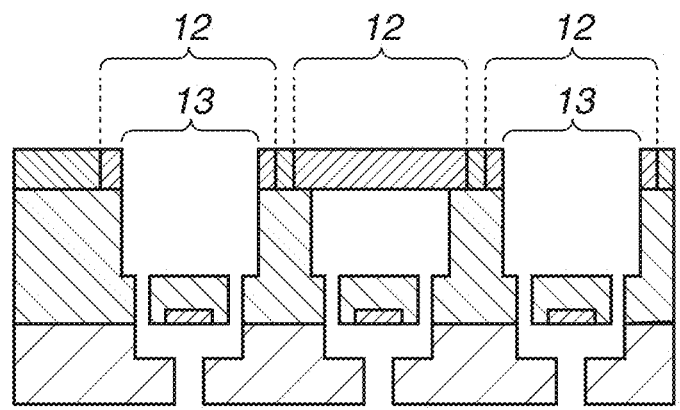

FIG. 6A illustrates the light non-irradiation regions 12 and 13 in cross section of the liquid discharge head taken along II-II' illustrated in FIG. 5E, when a mask illustrated in FIG. 5A is used in the first light irradiation process and a mask illustrated in FIG. 5D is used in the second light irradiation process. Further, similarly, FIG. 6B illustrates the light non-irradiation regions 12 and 13 in cross section of the liquid discharge head taken along II-II' illustrated in FIG. 5E, when a mask illustrated in FIG. 5B is used in the first light irradiation process and the mask illustrated in FIG. 5D is used in the second light irradiation process.

The exposure dose in the first light irradiation process is not especially limited, but, in the case where the region on the recessed portion is exposed, the shape of the opening 5a formed in the second light irradiation process may become instable due to the diffused reflection from the bottom of the recessed portion. Therefore, desirably, the exposure dose is set so as to satisfy (the exposure dose)<(the exposure dose for gelling the photosensitive resin layer 5)/{(the transmittance of the support layer 9)×(the transmittance of the photosensitive resin layer 5)×(the reflectivity of the substrate 1)}. The transmittance and the reflectivity here are the values with respect to the light transmitted through the support layer 9 and used to irradiate the photosensitive resin layer 5 therewith.

However, even in the case where the region on the recessed portion is exposed in the first light irradiation process, the light non-irradiation region 13 in the second light irradiation process is set inside of the light non-irradiation region 12 in the first light irradiation process. This arrangement can reduce an influence exerted on the shape of the opening 5a in the second light irradiation process even if the exposure dose exceeds the above-described range of the exposure dose to some degree.

Further, if there is a foreign substance on the support layer 9, a hole may be formed in the photosensitive resin layer 5 on the recessed portion because the foreign substance works as the mask, but the photosensitive resin layer 5 below the foreign substance is exposed due to the diffusely reflected light of the light with which the region on the recessed portion is irradiated in the first light irradiation process, whereby the formation of the hole can be prevented or reduced. Especially, in such a case that the recessed portion serves as the flow passage of the liquid and a plurality of recessed portions is filled with liquid of multiple colors with the photosensitive resin layer 5 used as a partition wall therebetween, it is desirable to use the mask that allows the region on the recessed portion to be exposed in the first light irradiation process, to prevent or reduce color mixing due to a liquid leak accompanying the formation of the hole. In a case where such a hole is not formed due to the exposure or there is no influence on the color mixing and the like due to the hole, it is desirable to expose only the region b that excludes the effective chip a as illustrated in FIG. 4. Further, even in the case where the inside of the effective chip region a is also exposed as illustrated in FIGS. 5B and 5C in addition to the region b other than the effective chip region a, it is also desirable that the recessed portion is covered with the light non-irradiation region. In this case, the exposure is avoided on the region on the recessed portion, thereby not influencing the shape of the opening 5a and thus allowing the photosensitive resin layer 5 to be irradiated with the light by a higher exposure dose exceeding the above-described range of the exposure dose.

The exemplary embodiment can further effectively prevent or reduce the deformation of the pattern by heating the photosensitive resin layer 5 at 30 degrees Celsius or higher and X degrees Celsius or lower for one minute or longer in the first heating process, and further performing the first light irradiation process and the second light irradiation process before the first heating process.

In the exemplary embodiment, the photosensitive resin layer 5 may be heated (a third heating process) between the first heating process and the process for separating the support layer 9. A heating temperature (a third temperature) in the third heating process does not have to be the temperature of the softening point of the photosensitive resin or lower (X degrees Celsius or lower), in a case where the photosensitive resin layer 5 has been heated at the first temperature for a sufficient time period in the first heating process and has been cured to be difficult to move. However, it is desirable that the heating temperature in the third heating process is set so as to be higher than the first temperature. The heating temperature in the third heating process is desirably X+20 degrees Celsius or lower, and is more desirably X+10 degrees Celsius or lower. Further, desirably, the third temperature is set so as to be lower than the second temperature, and the temperatures are set so as to increase in the order of the first temperature, the third temperature, and the second temperature from the first heating process (the first temperature) toward the second heating process (the second temperature).

The third heating process should be performed later than the first heating process, but may be performed simultaneously with the process at the time of the separation of the support layer 9. In other words, for example, the support layer 9 may be separated in the middle of the heating in the third heating process.

The method for manufacturing the structure has been described by using the method for manufacturing the liquid discharge head as one example thereof, but the exemplary embodiment is not limited thereto. More specifically, the exemplary embodiment can be applied to any structure in which, with respect to a substrate with a recessed portion provided therein, the recessed portion is covered with a photosensitive resin layer. For example, the exemplary embodiment can be applied to processing of a semiconductor substrate.

First, in Example 1, the substrate 1 including the energy generation element 2 on the front surface thereof was prepared as illustrated in FIG. 2A. The substrate 1 was made from single-crystal silicon, and was 500 µm in thickness. The energy generation element 2 was made from TaSiN. A not-illustrated wiring was connected to the energy generation element 2. Further, the mold material 8 was provided on the front surface of the substrate 1 so as to cover the energy generation element 2. As the mold material 8, ODMR-1010 (produced by Tokyo Ohka Kogyo Company Limited), which was positive photosensitive resin, was applied with a thickness of 14 µm by the spin coating, and was dried. Next, after pattern irradiation with Deep-UV light, the mold material 8 was subjected to development using methyl isobutyl ketone by CDS-8000, and was rinsed with use of isopropyl alcohol. By these processes, the mold material 8 was formed into a pattern serving as the mold material for the flow passage and the pressure chamber like the one illustrated in FIG. 2A. The mold material 8 was covered with the flow passage member 7. The flow passage member 7 was formed by first applying a negative photosensitive resin composition having the following composition with a thickness of 10 µm by the spin coating so as to cover the mold material 8 therewith, and drying this composition.

EHPE-3150 (produced by Daicel Chemical Industries Limited): 100 parts by mass
A-187 (produced by Nippon Unicar Company Limited): 5 parts by mass
SP-170 (produced by Asahi Denka Kogyo Kabushiki Kaisya): 2 parts by mass
xylene: 80 parts by mass After being dried, the flow passage member 7 was exposed to ultraviolet light with use of a stepper, and was heated next and was further subjected to development with use of mixed liquid of methyl isobutyl ketone/xylene=2/3 (a mass ratio), by which the discharge port 4 was formed in the flow passage member 7.

Next, rubber resin was coated on the front surface and the periphery of the substrate 1 to protect the flow passage member 7 and the like. After that, the substrate 1 was subjected to the reactive ion etching, by which the feed hole 3 as a recessed portion of 400 µm in depth and 200 µm in width, and the feed hole 6 establishing the communication between the feed hole 3 and the front surface of the substrate 1 were formed therein as illustrated in FIG. 2B.

Next, the photosensitive resin layer 5 was formed on the support layer 9, by which the film 16 was prepared. As illustrated in FIG. 2C, the film 16 was attached to the back surface of the substrate 1 having a reflectivity of 60% with respect to an i-line that had been subjected to mirror-surface finishing, with use of the lamination apparatus at a stage temperature of 45 degrees Celsius, a roller temperature of 45 degrees Celsius, a roller pressure of 0.1 MPa, and a roller speed of 50 mm/s. By this lamination, the feed hole 3, which was the recessed portion, was covered with the photosensitive resin layer 5. ZeonorFilm ZF16 (produced by Zeon Corporation) of 50 µm in thickness was used as the support layer 9 of the film 16. The transmittance of this support layer 9 with respect to the i-line was 90%. The photosensitive resin layer 5 was formed with use of TMMR S-2000

(produced by Tokyo Ohka Kogyo Company Limited). The exposure dose for gelling the photosensitive resin layer 5 was 70 mJ/cm$^2$. TMMR S-2000 was applied to the support layer 9 with a thickness of 20 μm by the spin coating, by which the photosensitive resin layer 5 was formed. When the transmittance of the photosensitive resin layer 5 with respect to the i-line was measured, this transmittance was 80%.

When the softening point of the photosensitive resin contained in the photosensitive resin layer 5 was measured with use of a thermal analysis instrument (TMA produced by Seiko Instruments Incorporated), this softening point was 45 degrees Celsius.

Next, as illustrated in FIG. 2D, with use of an i-line exposure machine capable of performing alignment, the photosensitive resin layer 5 was irradiated with the light 11 via the mask 10 on which the pattern of the opening 5a was drawn as a light shielding portion. The exposure dose was set to 150 mJ/cm$^2$. The light shielding portion (the light non-irradiation region) of the mask 10 was set to be the pattern illustrated in FIG. 5D.

Next, as illustrated in FIG. 2E, the photosensitive resin layer 5 was heated by the heating apparatus (the hot plate) at 35 degrees Celsius for ten minutes (the first heating process).

Next, as illustrated in FIG. 2F, the support layer 9 was separated from the photosensitive resin layer 5. Further, as illustrated in FIG. 2G, the photosensitive resin layer 5 was heated by the heating apparatus (the hot plate) at 90 degrees Celsius for five minutes (the second heating process). By these processes, the photosensitive resin layer 5 was cured.

Next, as illustrated in FIG. 2H, the photosensitive resin layer 5 was subjected to the development with use of propylene Glycol 1-monomethyl Ether 2-acetate, by which the opening 5a was formed in the photosensitive resin layer 5.

Next, as illustrated in FIG. 2I, the mold material 8 was removed with use of methyl lactate along with irradiation with Deep-UV light. Then, lastly, the entire structure was heated at 200 degrees Celsius for one hour. The liquid discharge head was manufactured in this manner.

Figure 3B:
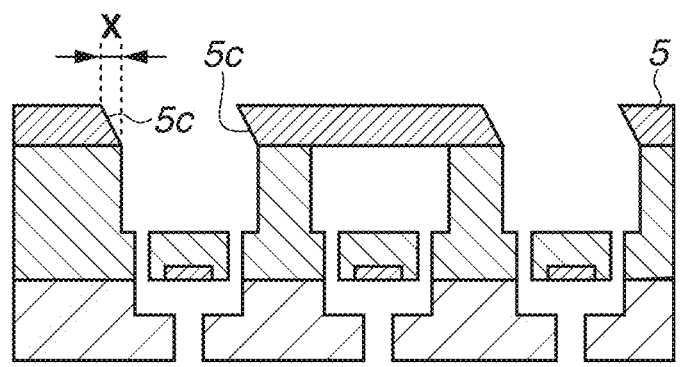

When the manufactured liquid discharge head was measured in terms of the deformation amount of the opening 5a (the length of x) indicated by arrows and dotted lines in FIG. 3B with use of VertScan (produced by Ryoka Systems Incorporated), this deformation amount was 2.5 μm at most. Further, when the opening 5a of the manufactured liquid discharge head was checked with use of an electronic microscope, it was not confirmed that the opening 5a was influenced by the diffused reflection at the time of the light irradiation. In the cross section illustrated in FIG. 3B, there is almost no influence of the diffused reflection at the time of the light irradiation. The influence of the diffused reflection appears at a side 5b illustrated in FIG. 5E. The recessed portion extends under the side 5b over a front side thereof and therefore the side b is influenced by the diffused reflection, but two sides 5c illustrated in FIG. 3B are almost free from the influence of the diffused reflection from the bottom of the recessed portion. Therefore, the influence of the diffused reflection was the influence confirmed at the side 5b.

In Example 2, the liquid discharge head was manufactured in a similar manner to Example 1, except that the photosensitive resin layer 5 was heated at 45 degrees Celsius for five minutes in the first heating process. The deformation amount of the opening 5a of the manufactured liquid discharge head was 9.7 μm at most. Further, when the opening 5a of the manufactured liquid discharge head was checked with use of the electronic microscope, it was not confirmed that the opening 5a was influenced by the diffused reflection at the time of the light irradiation.

In Example 3, subsequently to being heated at 35 degrees Celsius for ten minutes in the first heating process, the photosensitive resin layer 5 was further heated at 50 degrees Celsius for five minutes (the third heating process). The liquid discharge head was manufactured in a similar manner to Example 1 except for that. The deformation amount of the opening 5a of the manufactured liquid discharge head was 4.4 μm at most. Further, when the opening 5a of the manufactured liquid discharge head was checked with use of the electronic microscope, it was not confirmed that the opening 5a was influenced by the diffused reflection at the time of the light irradiation.

In Example 4, the liquid discharge head was manufactured in a similar manner to Example 3, except that the photosensitive resin layer 5 was heated at 35 degrees Celsius for three minutes in the first heating process. The deformation amount of the opening 5a of the manufactured liquid discharge head was 8.1 μm at most. Further, when the opening 5a of the manufactured liquid discharge head was checked with use of the electronic microscope, it was not confirmed that the opening 5a was influenced by the diffused reflection at the time of the light irradiation.

In Example 5, the liquid discharge head was manufactured in a similar manner to Example 3, except that the photosensitive resin layer 5 was heated at 35 degrees Celsius for five minutes in the first heating process. The deformation amount of the opening 5a of the manufactured liquid discharge head was 6.6 μm at most. Further, when the opening 5a of the manufactured liquid discharge head was checked with use of the electronic microscope, it was not confirmed that the opening 5a was influenced by the diffused reflection at the time of the light irradiation.

In Example 6, the liquid discharge head was manufactured in a similar manner to Example 3, except that the photosensitive resin layer 5 was heated at 35 degrees Celsius for 30 minutes in the first heating process. The deformation amount of the opening 5a of the manufactured liquid discharge head was 4.0 μm at most. Further, when the opening 5a of the manufactured liquid discharge head was checked with use of the electronic microscope, it was not confirmed that the opening 5a was influenced by the diffused reflection at the time of the light irradiation.

In Example 7, the liquid discharge head was manufactured in a similar manner to Example 3, except that the photosensitive resin layer 5 was irradiated with the light 11 by an exposure dose of 400 mJ/cm$^2$. The deformation amount of the opening 5a of the manufactured liquid discharge head was 2.7 μm at most. Further, when the opening 5a of the manufactured liquid discharge head was checked with use of the electronic microscope, the opening 5a was slightly influenced by the diffused reflection at the time of the light irradiation.

In Example 8, the light irradiation process in Example 3 was performed twice. First, as the first light irradiation process, the photosensitive resin layer 5 was irradiated with the light by an exposure dose of 1000 mJ/cm$^2$ with use of the mask illustrated in FIG. 5A according to which the photosensitive resin layer 5 on the recessed portion was set as the light non-irradiation region. Further, after that, as the second light irradiation process, the photosensitive resin layer 5 was irradiated with the light by the exposure dose of 150 mJ/cm$^2$ with use of the mask illustrated in FIG. 5D. The liquid discharge head was manufactured in a similar manner to Example 3 except for them. The opening 5a of the manufactured liquid discharge head was not deformed (the deformation amount was 0 μm). Further, when the opening 5a of the manufactured liquid discharge head was checked with use of the electronic microscope, the opening 5a was slightly influenced by the diffused reflection at the time of the light irradiation. Further, while the formation of the hole was confirmed on a flat surface portion other than the recessed portion, no formation of the hole was confirmed on the recessed portion.

In Example 9, as the first light irradiation process in Example 8, the photosensitive resin layer 5 was irradiated with use of the mask illustrated in FIG. 5C according to which the photosensitive resin layer 5 on the recessed portion was set as the light non-irradiation region. The liquid discharge head was manufactured in a similar manner to Example 8 except for that. The opening 5a of the manufactured liquid discharge head was not deformed (the deformation amount was 0 μm). Further, when the opening 5a of the manufactured liquid discharge head was checked with use of the electronic microscope, it was not confirmed that the opening 5a was influenced by the diffused reflection at the time of the light irradiation.

In Example 10, the exposure dose in the light irradiation process was set to 1150 mJ/cm² without performing the first light irradiation process in Example 8. The liquid discharge head was manufactured in a similar manner to Example 8 except for that. The opening 5a of the manufactured liquid discharge head was not deformed (the deformation amount was 0 μm). However, when the opening 5a of the manufactured liquid discharge head was checked with use of the electronic microscope, it was confirmed that the opening 5a was influenced by the diffused reflection at the time of the light irradiation.

In Comparative Example 1, the liquid discharge head was manufactured in a similar manner to Example 1, except that the photosensitive resin layer 5 was heated at 90 degrees Celsius for five minutes in the first heating process. The deformation amount of the opening 5a of the manufactured liquid discharge head was 92.0 μm at most. Further, when the opening 5a of the manufactured liquid discharge head was checked with use of the electronic microscope, it was not confirmed that the opening 5a was influenced by the diffused reflection at the time of the light irradiation.

In Comparative Example 2, the photosensitive resin layer 5 was heated at 90 degrees Celsius for five minutes in the first heating process, and, further, the second heating process was not performed after the support layer 9 was separated. The liquid discharge head was manufactured in a similar manner to Example 1 except for them. The deformation amount of the opening 5a of the manufactured liquid discharge head was 90.0 μm at most. Further, when the opening 5a of the manufactured liquid discharge head was checked with use of the electronic microscope, it was not confirmed that the opening 5a was influenced by the diffused reflection at the time of the light irradiation.

In Comparative Example 3, the liquid discharge head was manufactured in a similar manner to Example 1, except that the photosensitive resin layer 5 was heated at 50 degrees Celsius for five minutes in the first heating process. The deformation amount of the opening 5a of the manufactured liquid discharge head was 27.0 μm at most. Further, when the opening 5a of the manufactured liquid discharge head was checked with use of the electronic microscope, it was not confirmed that the opening 5a was influenced by the diffused reflection at the time of the light irradiation.

In Comparative Example 4, the liquid discharge head was manufactured in a similar manner to Comparative Example 3, except that the exposure dose in the light irradiation process was set to 400 mJ/cm². The deformation amount of the opening 5a of the manufactured liquid discharge head was 16.0 μm at most. Further, when the opening 5a of the manufactured liquid discharge head was checked with use of the electronic microscope, the opening 5a was slightly influenced by the diffused reflection at the time of the light irradiation.

In Comparative Example 5, the liquid discharge head was manufactured in a similar manner to Example 8, except that the photosensitive resin layer 5 was heated at 50 degrees Celsius for five minutes in the first heating process. The deformation amount of the opening 5a of the manufactured liquid discharge head was 9.8 μm at most. Further, when the opening 5a of the manufactured liquid discharge head was checked with use of the electronic microscope, it was not confirmed that the opening 5a was influenced by the diffused reflection at the time of the light irradiation.

(Result)

The results of the above-described examples and comparative examples will be listed in the following table.

| | Exposure Dose (mJ/cm²) | | First Heating Process | | Third Heating Process | | Second Heating Process | | Maximum | |
| | Light Irradiation (First Light Irradiation) | Light Irradiation (Second Light Irradiation) | Temperature (degree Celsius) | Time Period (minute) | Temperature (degree Celsius) | Time Period (minute) | Temperature (degree Celsius) | Time Period (minute) | Deformation Amount of Opening Portion (μm) | Influence of Irradiation Light on Shape of Opening |
|---|---|---|---|---|---|---|---|---|---|---|
| Example 1 | — | 150 | 35 | 10 | — | — | 90 | 5 | 2.5 | None |
| Example 2 | — | 150 | 45 | 5 | — | — | 90 | 5 | 9.7 | None |
| Example 3 | — | 150 | 35 | 10 | 50 | 5 | 90 | 5 | 4.4 | None |
| Example 4 | — | 150 | 35 | 3 | 50 | 5 | 90 | 5 | 8.1 | None |
| Example 5 | — | 150 | 35 | 5 | 50 | 5 | 90 | 5 | 6.6 | None |
| Example 6 | — | 150 | 35 | 30 | 50 | 5 | 90 | 5 | 4 | None |
| Example 7 | — | 400 | 35 | 10 | 50 | 5 | 90 | 5 | 2.7 | Small |
| Example 8 | 1000 | 150 | 35 | 10 | 50 | 5 | 90 | 5 | 0 | Small |
| Example 9 | 1000 | 150 | 35 | 10 | 50 | 5 | 90 | 5 | 0 | None |
| Example 10 | — | 1150 | 35 | 10 | 50 | 5 | 90 | 5 | 0 | Intermediate |
| Comparative Example 1 | — | 150 | 90 | 5 | — | — | 90 | 5 | 92 | None |
| Comparative Example 2 | — | 150 | 90 | 5 | — | — | — | — | 90 | None |

-continued

| | Exposure Dose (mJ/cm²) | | First Heating Process | | Third Heating Process | | Second Heating Process | | Maximum Deformation Amount of Opening Portion (μm) | Influence of Irradiation Light on Shape of Opening |
|---|---|---|---|---|---|---|---|---|---|---|
| | Light Irradiation (First Light Irradiation) | Light Irradiation (Second Light Irradiation) | Temperature (degree Celsius) | Time Period (minute) | Temperature (degree Celsius) | Time Period (minute) | Temperature (degree Celsius) | Time Period (minute) | | |
| Comparative Example 3 | — | 150 | 50 | 5 | — | — | 90 | 5 | 27 | None |
| Comparative Example 4 | — | 400 | 50 | 5 | — | — | 90 | 5 | 16 | Small |
| Comparative Example 5 | 1000 | 150 | 50 | 5 | — | — | 90 | 5 | 9.8 | None |

The exemplary embodiment eliminates or reduces the maximum deformation amount of the opening 5a with the aid of the first heating temperature. The softening point (X degrees Celsius) of the photosensitive resin contained in the photosensitive resin layer 5 was 45 degrees Celsius. Then, in any of Examples 1 to 10 in which the photosensitive resin layer 5 was heated at 30 degrees Celsius or higher and X degrees Celsius or lower for one minute or longer before the support layer 9 was separated, the maximum deformation amount of the opening 5a exhibited a value as small as 9.7 μm or less. However, in Comparative Examples 1 to 5 in which the photosensitive resin layer 5 was not heated in this manner, the maximum deformation amount of the opening 5a exhibited a larger value than that even when the light irradiation process was divided into two times of irradiation like Comparative Example 5.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-106457, filed May 27, 2016, which is hereby incorporated by reference herein in its entirety.

What is claimed is:

1. A method for manufacturing a structure including a substrate with a recessed portion provided therein and a photosensitive resin layer at least partially covering the recessed portion, the method comprising, in the following order:
   preparing the substrate with the recessed portion provided therein;
   attaching a film including the photosensitive resin layer containing photosensitive resin therein and a support layer supporting the photosensitive resin layer to the substrate to at least partially cover the recessed portion with the photosensitive resin layer;
   irradiating the photosensitive resin layer covering the recessed portion with light via the support layer to form a latent image pattern on the photosensitive resin layer covering the recessed portion;
   heating, as a first heating, the photosensitive resin layer by a heating apparatus at 30 degrees Celsius or higher and X degrees Celsius or lower for one minute or longer, wherein a softening point of the photosensitive resin is X degrees Celsius and X≥30;
   separating the support layer from the photosensitive resin layer;
   heating, as a second heating, the photosensitive resin layer by a heating apparatus at X+10 degrees Celsius or higher; and
   carrying out development on the photosensitive resin layer.

2. The method for manufacturing the structure according to claim 1, wherein a heating temperature in the first heating is 30 degrees Celsius or higher and 45 degrees Celsius or lower.

3. The method for manufacturing the structure according to claim 2, further comprising heating, as a third heating, the photosensitive resin layer by a heating apparatus at a higher temperature than the heating temperature in the first heating between the first heating and the separating.

4. The method for manufacturing the structure according to claim 3, wherein the heating temperature in the third heating is X+20 degrees Celsius or lower.

5. The method for manufacturing the structure according to claim 2, wherein a heating temperature in the second heating is higher than the heating temperature in the first heating by 30 degrees Celsius or higher.

6. The method for manufacturing the structure according to claim 2, wherein the heating apparatus is at least any of a hot plate and a heater.

7. The method for manufacturing the structure according to claim 1, wherein a heating temperature in the second heating is 80 degrees Celsius or higher and 120 degrees Celsius or lower.

8. The method for manufacturing the structure according to claim 7, further comprising heating, as a third heating, the photosensitive resin layer by a heating apparatus at a higher temperature than a heating temperature in the first heating between the first heating and the separating.

9. The method for manufacturing the structure according to claim 8, wherein the heating temperature in the third heating is X+20 degrees Celsius or lower.

10. The method for manufacturing the structure according to claim 1, further comprising heating, as a third heating, the photosensitive resin layer by a heating apparatus at a higher temperature than the heating temperature in the first heating between the first heating and the separating.

11. The method for manufacturing the structure according to claim 10, wherein the heating temperature in the third heating is X+20 degrees Celsius or lower.

12. The method for manufacturing the structure according to claim 10, wherein the heating temperature in the third heating is a lower temperature than a heating temperature in the second heating.

13. The method for manufacturing the structure according to claim 1, wherein a heating temperature in the second heating is higher than a heating temperature in the first heating by 30 degrees Celsius or higher.

14. The method for manufacturing the structure according to claim 1, wherein the photosensitive resin is negative photosensitive resin.

15. The method for manufacturing the structure according to claim 1, wherein the support layer is made from at least one member selected from the group consisting of polypropylene, polycarbonate, polyethylene terephthalate, and polyimide.

16. The method for manufacturing the structure according to claim 1, wherein the heating apparatus is at least one of a hot plate and a heater.

17. A method for manufacturing a liquid discharge head including a substrate with a recessed portion provided therein and a photosensitive resin layer at least partially covering the recessed portion, the method comprising, in the following order:
  preparing the substrate with the recessed portion being used as a feed hole in the liquid discharge head provided therein;
  attaching a film including the photosensitive resin layer containing photosensitive resin therein and a support layer supporting the photosensitive resin layer to the substrate to at least partially cover the recessed portion with the photosensitive resin layer;
  irradiating the photosensitive resin layer covering the recessed portion with light via the support layer to form a latent image pattern on the photosensitive resin layer covering the recessed portion;
  heating, as a first heating, the photosensitive resin layer by a heating apparatus at 30 degrees Celsius or higher and X degrees Celsius or lower for one minute or longer, wherein a softening point of the photosensitive resin is X degrees Celsius and X≥30;
  separating the support layer from the photosensitive resin layer;
  heating, as a second heating, the photosensitive resin layer by a heating apparatus at X+10 degrees Celsius or higher; and
  carrying out development on the photosensitive resin layer.

18. The method for manufacturing the liquid discharge head according to claim 17,
  wherein the irradiating is carried out a plurality of times as first light irradiation and second light irradiation,
  wherein, in the first light irradiation, at least a region that excludes an effective chip region is irradiated with the light while at least a part of the photosensitive resin layer on the recessed portion is set as a light non-irradiation region, and
  wherein, in the second light irradiation subsequent to the first light irradiation, at least the effective chip region is irradiated with the light while a region inside the light non-irradiation region in the first light irradiation is set as a light non-irradiation region in the second light irradiation.

19. The method for manufacturing the liquid discharge head according to claim 18, wherein, in the first light irradiation, the effective chip region and a region other than the effective chip region are irradiated with the light.

20. The method for manufacturing the liquid discharge head according to claim 17,
  wherein the irradiating is carried out a plurality of times as first light irradiation and second light irradiation,
  wherein, in the first light irradiation, at least an effective chip region is irradiated with the light while at least a part of the photosensitive resin layer on the recessed portion is set as a light non-irradiation region, and
  wherein, in the second light irradiation subsequent to the first light irradiation, at least the effective chip region is irradiated with the light while a region inside the light non-irradiation region in the first light irradiation is set as a light non-irradiation region in the second light irradiation.

* * * * *